United States Patent [19]
Yoshida

[11] Patent Number: 5,723,886
[45] Date of Patent: Mar. 3, 1998

[54] N CHANNEL MOSFET WITH ANTI-RADIOACTIVITY

[75] Inventor: Kousuke Yoshida, Tokyo, Japan

[73] Assignee: NEC Corporation, Japan

[21] Appl. No.: 307,487

[22] Filed: Sep. 16, 1994

Related U.S. Application Data

[63] Continuation of Ser. No. 1,831, Jan. 8, 1993, abandoned.

[30] Foreign Application Priority Data

Jan. 9, 1992 [JP] Japan ...................... 4-001964

[51] Int. Cl.$^6$ .............. H01L 27/108; H01L 29/76; H01L 27/01; H01L 29/94
[52] U.S. Cl. .............. 257/305; 257/346; 257/349; 257/354; 257/376; 257/400; 257/409; 257/509
[58] Field of Search ...................... 257/305, 346, 257/349, 354, 376, 400, 409, 500, 509

[56] References Cited

U.S. PATENT DOCUMENTS

| | | | |
|---|---|---|---|
| 5,041,887 | 8/1991 | Kumagai et al. | 257/305 |
| 5,045,898 | 9/1991 | Chen et al. | 257/305 |
| 5,125,007 | 6/1992 | Yamaguchi et al. | 257/349 |
| 5,164,806 | 11/1992 | Nagatomo et al. | 257/409 |

FOREIGN PATENT DOCUMENTS 1164265 7/1986 Japan.

*Primary Examiner*—Sara W. Crane
*Assistant Examiner*—Valencia Martin Wallace
*Attorney, Agent, or Firm*—Laff, Whitesel, Conte & Saret, Ltd.

[57] ABSTRACT

The invention provides an n-channel MOS field effect transistor with an improved anti-radioactivity. Such transistor includes a p-type silicon substrate. An isolation oxide film is selectively formed on a surface of the p-type silicon substrate. Source and drain diffusion layers of n+-type are formed on first opposite sides of a channel region in the p-type silicon substrate. A gate made of polycrystalline silicon is formed over the channel region through a gate oxide film. Leak guard diffusion layers of p-type are formed on second opposite sides of the channel region in the p-type silicon substrate. The p-type leak guard diffusion layer has a junction surface to the isolation oxide film. The junction surface of the p-type leak guard diffusion layer and the isolation oxide film exists up to a level which is deeper than a depth of the n+-type source and drain diffusion layers.

4 Claims, 8 Drawing Sheets

(THE BOTTOM OF
SOURCE AND DRAIN 2)

N CHANNEL MOSFET WITH ANTI-RADIOACTIVITY

This application is a continuation of application Ser. No. 08/001,831, filed Jan. 8, 1993 now abandoned.

BACKGROUND OF THE INVENTION

The invention relates to a semiconductor device and a method of fabricating the same, and more particularly to an n-channel metal oxide semiconductor field effect transistor (MOSFET) having an improved anti-radioactivity.

The conventional structure of the MOS field effect transistor will be described with reference to FIGS. 1 and 2.

The structure of the n-channel MOS transistor has a p-type silicon substrate 6. Silicon oxide films 4 serving as isolation films are formed on non-active region of the p-type silicon substrate 6 thereby defining an active region of the device. A gate oxide film 5 is formed on the p-type silicon substrate 6. Guard rings 1 comprising p-type diffusion layers doped with boron are formed along both inside of the isolation oxide film 4. Diffusion layers 2 of an n$^+$-type serving as source and drain regions are formed in an upper region of the p-type silicon substrate 6 on opposite sides of a channel region. The n$^+$-type source and drain diffusion layers 2 are defined by the leak guard boron diffusion layers 1. The leak guard boron diffusion layers 1 exist below the gate oxide film 5. A gate 3 made of polycrystalline silicon is formed directly over the channel region through the gate oxide film 5. The polycrystalline silicon gate 3 further overlays a part of the silicon oxide film 4.

The method of fabricating the semiconductor device will subsequently be described with reference to FIGS. 3A to 3E.

With reference to FIG. 3A, a p-type silicon substrate 6 is prepared, after which a surface of the p-type silicon substrate 6 is subjected to a selective oxidation which uses an anti-oxide film such as a silicon nitride film thereby resulting a formation of a silicon oxide film 4 serving as an isolation films. After the anti-oxide film such as silicon nitride film is removed, an entire surface of the device is subjected to oxidation so as to form a thin oxide film 8. An ion-implantation of boron for controlling a threshold voltage is accomplished through the thin oxide film 8.

With reference to FIG. 3B, a photo-resist is applied on an entire surface of the device, followed by a patterning of the photo-resist, thereby resulting in a photo-resist mask 9 for ion-implantation. An ion-implantation of boron (B$^+$) is accomplished by using the photo-resist mask 9 so as to form boron diffusion layers 1 serving as leak guards.

With reference to FIG. 3C, the photo-resist mask 9 is removed, after which the thin oxide film is removed by etching.

With reference to FIG. 3D, a gate oxide film 5 is formed on the channel region of the p-type silicon substrate 6.

With reference to FIG. 3E, a chemical vapor deposition is so accomplished that polycrystalline silicon is deposited on the gate oxide film 5 and the isolation oxide film 4. The deposited polycrystalline silicon is patterned by an ion-etching method thereby forming a polycrystalline silicon gate 3. After that, n$^+$-type diffusion layers 2 serving as source and drain regions are formed by a self-alignment technique which uses the polycrystalline silicon gate 3 as a mask member.

Such n-type type MOS field effect transistor having an anti-raidoactivity is, however, engaged with following disadvantages. FIG. 4 is a fragmentary enlarged cross sectional view (taken at D in FIG. 2) illustrative of the leak guard boron diffusion layer 1. Disadvantages with the n-type MOS field effect transistor having an anti-radioactivity will be investigated with reference to FIG. 4.

The leak guard boron diffusion layer 1 is formed in an upper surface of the p-type silicon substrate 6. The gate oxide film 5 overlays the leak guard boron diffusion layer 1. The isolation oxide film 4 overlays the p-type silicon substrate 6. A broken line 10 indicates a junction level of he n$^+$-type source and drain diffusion layers and the p-type silicon substrate 6.

Disadvantages with the n-type n-channel MOS field effect transistor are caused by a radiation damage of the silicon oxide film. In general, when a radiation passes through the silicon oxide film such as the gate oxide film 5 and the isolation oxide film 4, electron-hole pairs are generated in the silicon oxide film. Electrons drift, but holes are trapped and thus remain in the silicon oxide film such as the gate oxide film 5 and the isolation oxide film 4. As a result of those drifting electrons and entrapped holes, an interface charge of holes is formed, by which electrons are caused at an adjacent portion to the interface of the silicon substrate 6 and the silicon oxide film such as the gate oxide film 5 and the isolation oxide film 4. Especially, electrons are caused at a leak pass portion 7 of the p-type silicon substrate 6. The leak pass portion 7 exists above the junction level line 10 between the n-type source and drain diffusion layers 2 and the p-type silicon substrate 6. (Line 10 is the bottom of the source and drain) Then, this makes the conductive type of the leak pass portion 7 inverse, and thus an inversion layer is formed at the leak pass portion 7 in the p-type silicon substrate 6. The n$^+$-type source and drain diffusion layers 2 becomes connective through the inversion layer formed in the leak pass portion 7 in the p-type silicon substrate 6. As a result of those, a leak is generated.

An inversion layer is formed in the p-type silicon substrate 6, since the p-type silicon substrate 6 has a low impurity concentration. In contrast, no inversion layer is formed in the leak guard boron diffusion layers 1, since the leak guard boron diffusion layers 1 has a high impurity concentration.

To combat those problems, it is required that the leak guard boron diffusion layer having a high impurity concentration occupies the leak pass portion 7 in the p-type silicon substrate 6 so as to prevent electrons to be caused at the leak pass portion 7 of the p-type silicon substrate 6. This prevents any inversion layer to be formed at the leak pass portion 7 in the p-type silicon substrate 6 thereby suppressing any leak to be generated.

With respect to the boron implantation process, in the prior art, the both ion-implantations of boron for controlling the threshold voltage and for forming the leak guard diffusion layers are accomplished before the formation of the gate oxide film 5 so as to prevent the gate oxide film 5 from any damage provided by such ion-implantations. This makes it difficult to introduces a sufficient quantity of boron into the side of the isolation oxide film 4. It is required to develop a novel method of fabricating an n-channel MOS field effect transistor having improved leak guard boron diffusion layers.

SUMMARY OF THE INVENTION

Accordingly, it is a primary object of the present invention to provide a novel n-channel MOS field effect transistor having a superior anti-radioactivity.

It is a further object of the present invention to provide a novel n-channel MOS field effect transistor having an improve leak guard boron diffusion layers.

It is another object of the present invention to provide a novel method of fabricating an n-channel MOS field effect transistor having an improve leak guard boron diffusion layers.

The above and other objects, features and advantages of the present invention will be apparent from the following descriptions.

The present invention essentially intends to provide an n-channel MOS field effect transistor with an improved anti-radioactivity. Such transistor includes a p-type silicon substrate. An isolation oxide film is selectively formed on a surface of the p-type silicon substrate. Source and drain diffusion layers of n⁺-type are formed on first opposite sides of a channel region in the p-type silicon substrate. A gate made of polycrystalline silicon is formed over the channel region through a gate oxide film. Leak guard diffusion layers of p-type are formed on second opposite sides of the channel region in the p-type silicon substrate. The p-type leak guard diffusion layer has a junction surface to the isolation oxide film. The junction surface of the p-type leak guard diffusion layer and the isolation oxide film exists up to a level which is deeper than a depth of the n⁺-type source and drain diffusion layers. Such a leak guard diffusion layer is doped with boron so as to make such layer have a dopant concentration in the range from $1.0 \times 10^{12}$ to $1.0 \times 10^{14}$ atoms/cm³. The dopant concentration of the leak guard boron diffusion layers is larger than that of the p-type silicon substrate. The existence of the leak guard diffusion layers suppresses formation of an inversion layer at a portion of the p-type silicon substrate above the junction levels of the n⁺-type source and drain diffusion layers and the p-type silicon substrate. Such an inversion layer is caused by radiation damage of the silicon oxide film such as the gate oxide film and the isolation oxide film.

The present invention also provides a novel method of fabricating an n-channel MOS field effect transistor with an improved leak guard boron diffusion layers. The method comprises following steps. An isolation oxide film is selectively formed in a surface of a p-type silicon substrate by using an anti-oxide film such as a silicon nitride film as a mask member. A channel region in the p-type silicon substrate is subjected to an ion-implantation of boron through a thin silicon oxide film so as to control a threshold voltage. A gate oxide film is formed on a channel region of the p-type silicon substrate. Leak guard diffusion layers of p-type are selectively formed in an upper portion of the p-type silicon substrate by an ion-implantation of boron so as to make the leak guard diffusion layers have a junction surface to the isolation oxide film in which the junction surface exists up to a level which is deeper than a predetermined depth. A gate made of polycrystalline silicon is formed over the channel region through the gate oxide film by a chemical vapor deposition. Source and drain diffusion layers of n⁺-type are formed by a self-alignment technique using the polycrystalline silicon gate as a mask member.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

Figure 1:
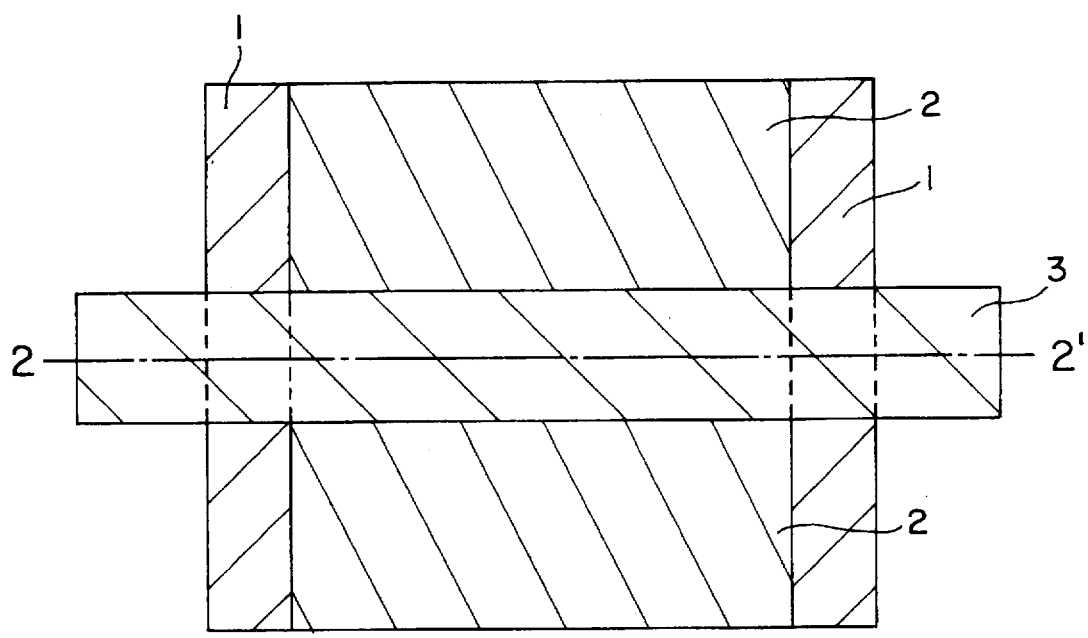
FIG. 1 is a fragmentary plane view illustrative of the conventional n-channel MOS field effect transistor having the leak guard boron diffusion layers.
Figure 2:
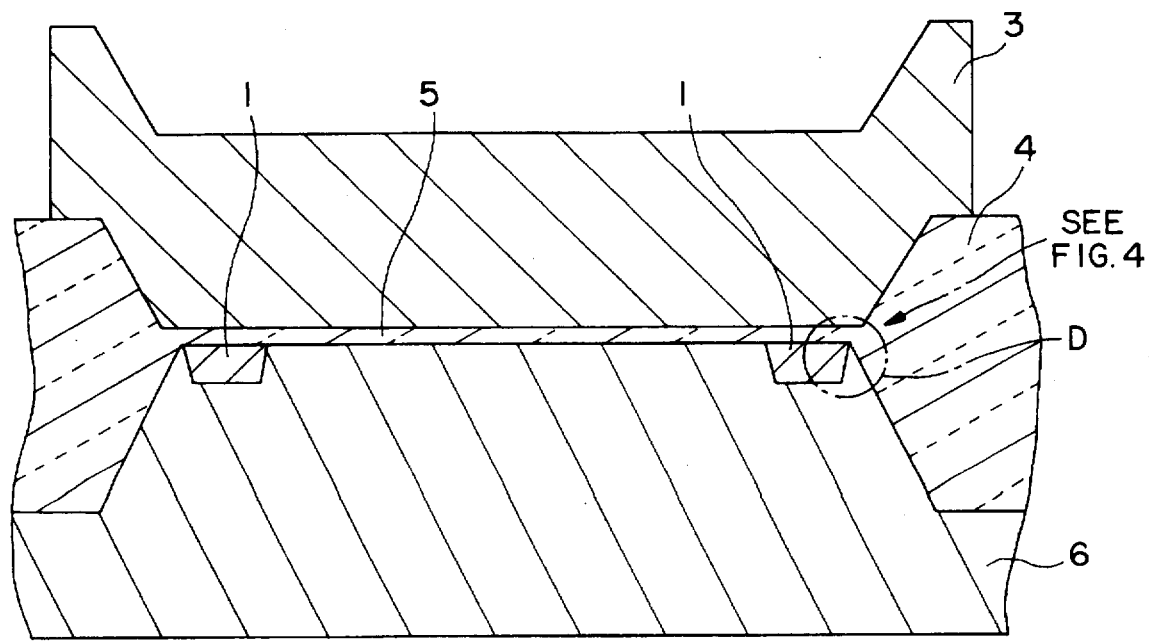
FIG. 2 is a fragmentary cross sectional elevation view taken along the line 2—2 of FIG. 1 illustrative of the conventional n-channel MOS field effect transistor having the leak guard boron diffusion layers.
Figure 3A:
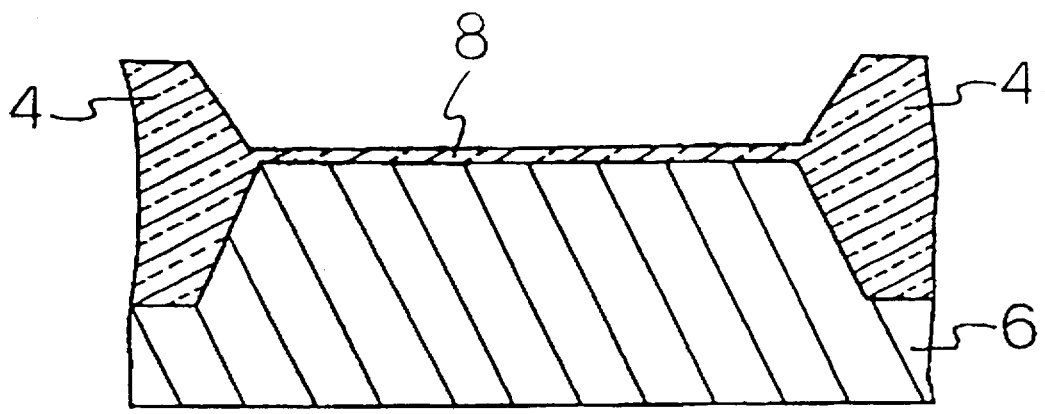
FIGS. 3A to 3E are fragmentary cross sectional elevation views illustrative of sequential steps involved in the conventional method of fabricating the n-channel MOS field effect transistor having the leak guard boron diffusion layers.
Figure 3B:
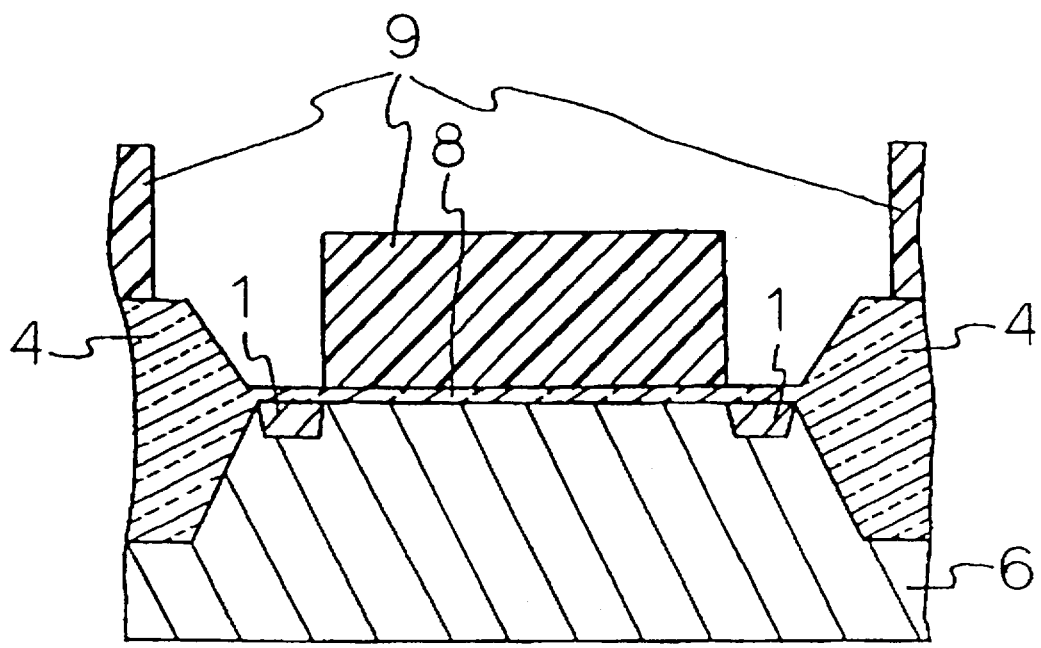
Figure 3C:
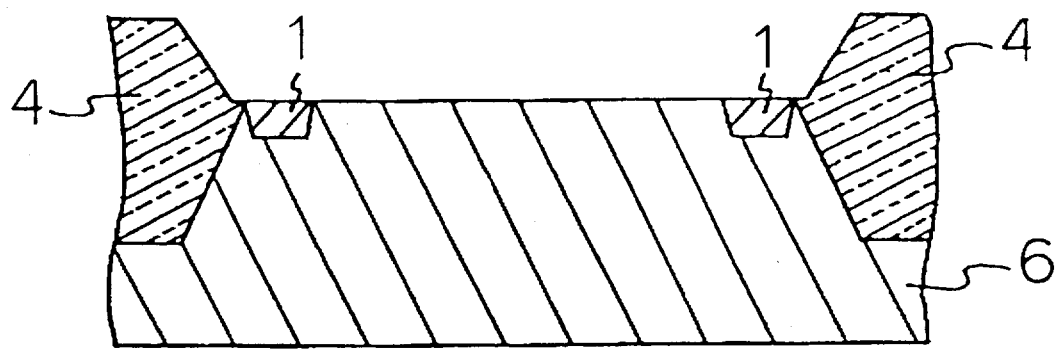
Figure 3D:
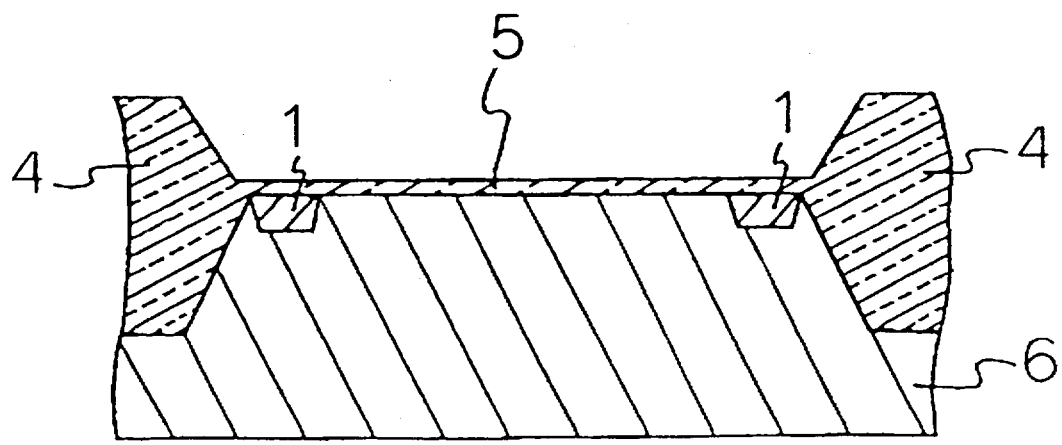
Figure 3E:
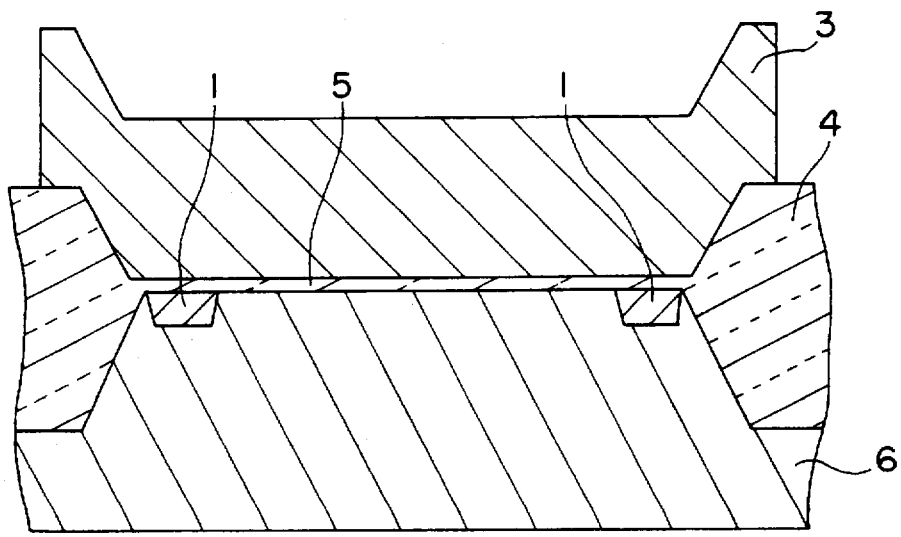
Figure 4:
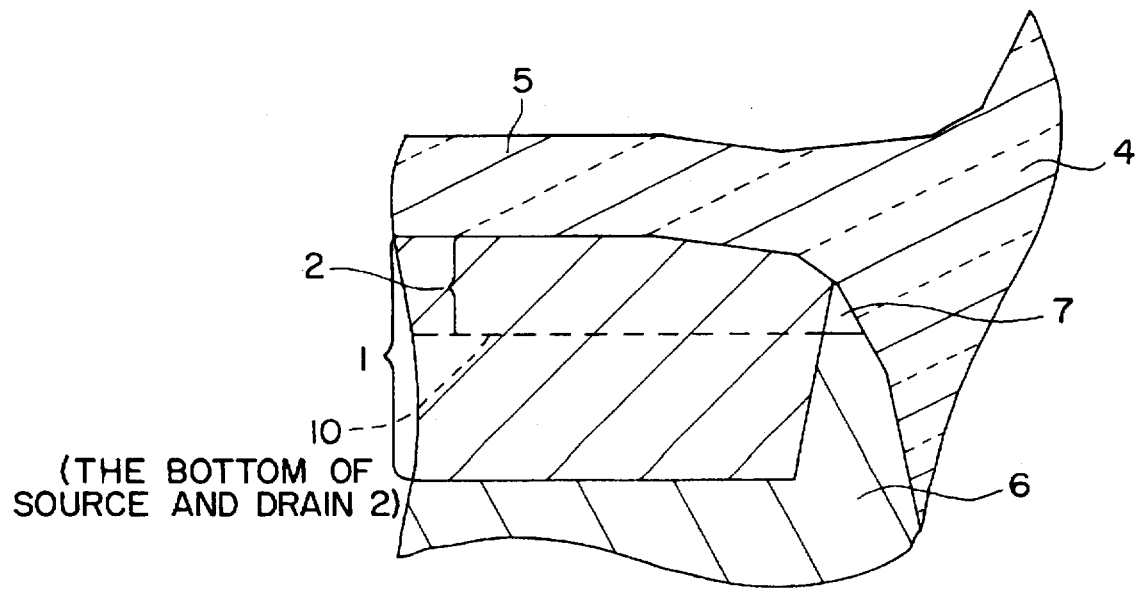
FIG. 4 is a fragmentary enlarged cross sectional elevation view (taken at D in FIG. 2) illustrative of the leak guard boron diffusion layer.
Figure 5:
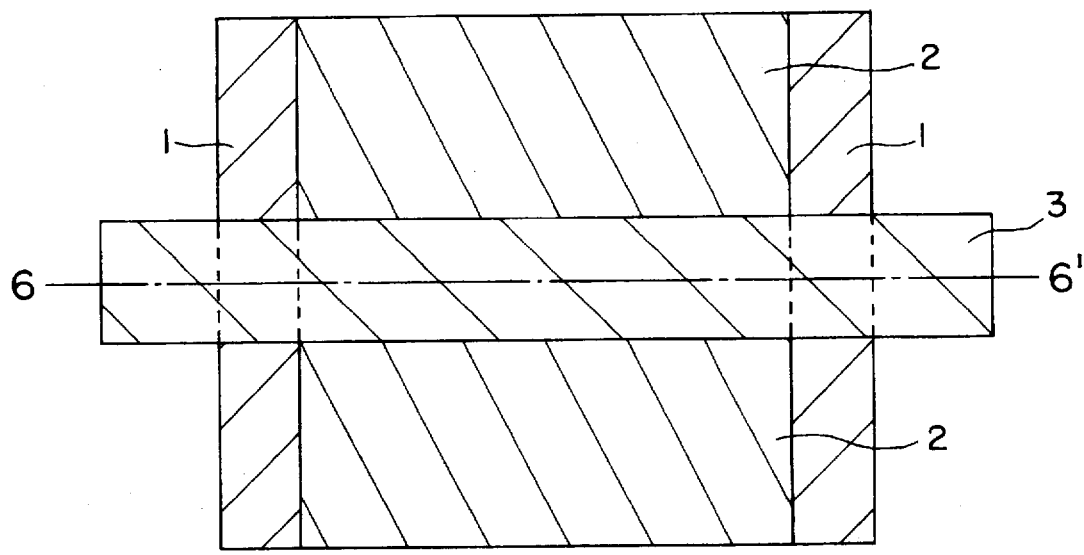
FIG. 5 is a fragmentary plane view illustrative of a novel n-channel MOS field effect transistor having improved leak guard boron diffusion layers.
Figure 6:
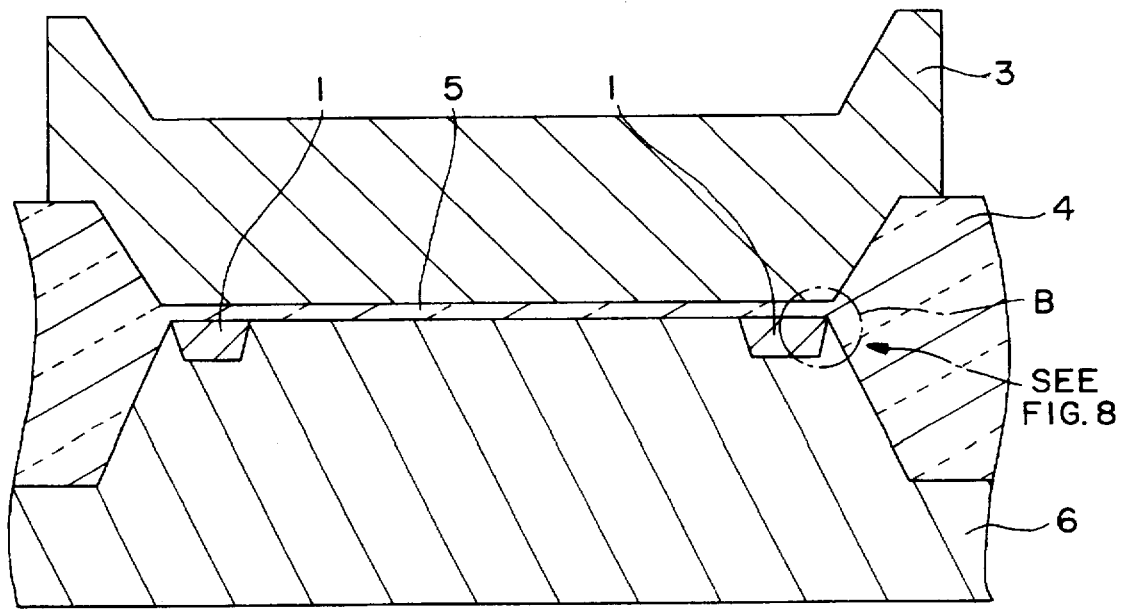
FIG. 6 is a fragmentary cross sectional elevation view taken along the line 6—6 of FIG. 5 illustrative of a novel n-channel MOS field effect transistor having improved leak guard boron diffusion layers.

The structure of an n-channel MOS field effect transistor will be described in detail with reference FIGS. 5 and 6. The structure of an n-channel MOS field effect transistor is analogies to that of the prior art, except for improved leak guard boron diffusion layers. The structure of the n-channel MOS transistor has a p-type silicon substrate 6. Silicon oxide films 4 serving as isolation films are formed on non-active region of the p-type silicon substrate 6 thereby defining an active region of the device. A gate oxide film 5 is formed on the p-type silicon substrate 6. Guard rings 1 comprising p-type diffusion layers doped with boron are formed along both inside of the isolation oxide film 4. Diffusion layers 2 of an n⁺-type serving as source and drain regions are formed in an upper region of the p-type silicon substrate 6 on opposite sides of a channel region. The n⁺-type source and drain diffusion layers 2 are defined by the leak guard boron diffusion layers 1. The leak guard boron diffusion layers 1 exist below the gate oxide film 5. A gate 3 made of polycrystalline silicon is formed directly over the channel region through the gate oxide film 5. The polycrystalline silicon gate 3 further overlays a part of the silicon oxide film 4.

The method of fabricating the semiconductor device will subsequently be described with reference to FIGS. 7A to 7D.

Figure 7A:
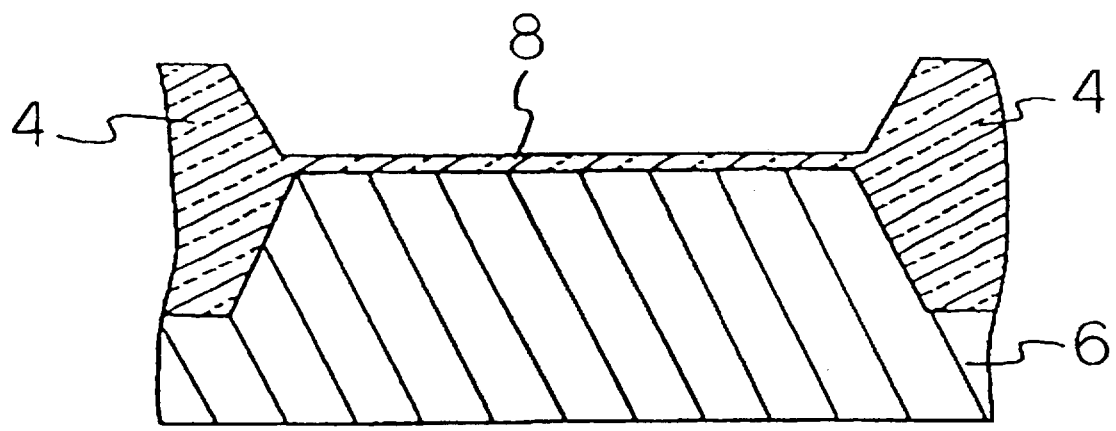
FIGS. 7A to 7D are fragmentary cross sectional elevation view illustrative of sequential steps involved in a novel method of fabricating an n-channel MOS field effect transistor having improved leak guard boron diffusion layers.

With reference to FIG. 7A, a p-type silicon substrate 6 having an impurity concentration in the range from approximately $1.0 \times 10^{15}$ to $1.0 \times 10^{17}$ atoms/cm³ is prepared, after which a surface of the p-type silicon substrate 6 is subjected to a selective oxidation which uses an anti-oxide film such as a silicon nitride film thereby resulting in a formation of a silicon oxide film 4 serving as an isolation films. The isolation oxide film 4 has a thickness in the range from 4000 to 10000 angstroms. After the anti-oxide film such as silicon nitride film is removed, an entire surface of the device is subjected to oxidation so as to form a thin oxide film 8 having a thickness in the range from 200 to 800 angstroms. An ion-implantation of boron for controlling a threshold voltage is accomplished through the thin oxide film 8.

Figure 7B:
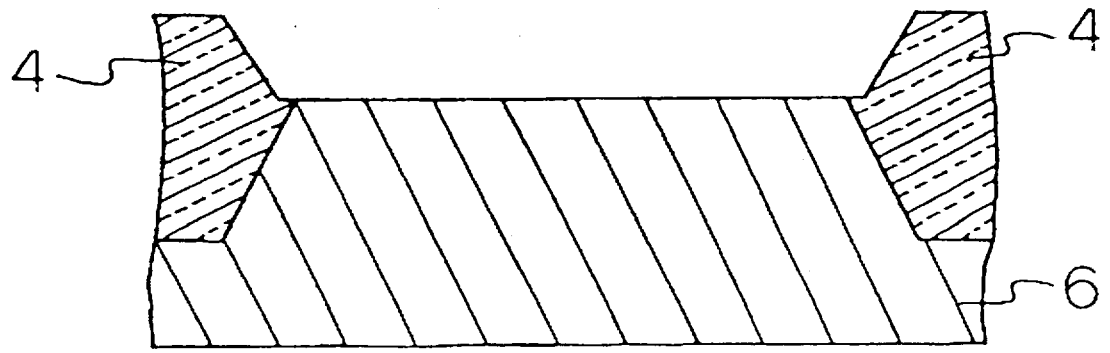

With reference to FIG. 7B, the thin oxide film 8 is removed so as to have the surface of the p-type silicon substrate 6 exposed.

Figure 7C:
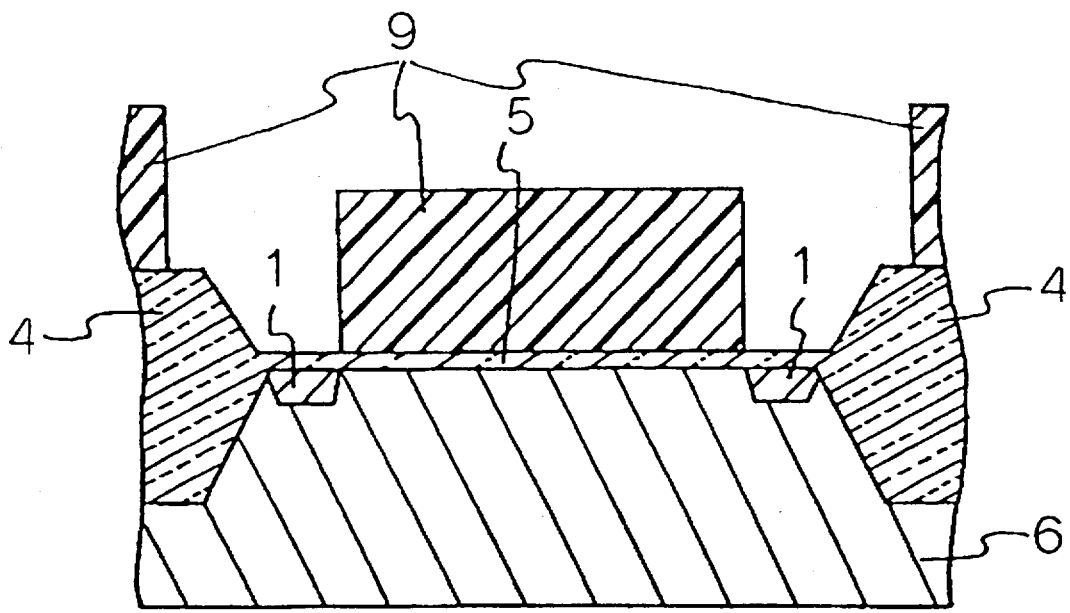

With reference to FIG. 7C, a gate oxide film 5 having a thickness in the range from 100 to 800 angstroms is formed on the channel region of the p-type silicon substrate 6. Subsequently, a photo-resist is applied on an entire surface of the device, followed by a patterning of the photo-resist, thereby resulting in a photo-resist mask 9 for ion-implantation. An ion-implantation of boron ($B^+$) is accomplished by using the photo-resist mask 9 so as to form boron diffusion layers 1 serving as leak guards. The leak guard boron diffusion layers 1 has an impurity concentration of boron in the range from $1.0 \times 10^{12}$ to $1.0 \times 10^{14}$ atoms/cm$^2$. At those time, a sufficient quantity of boron is implanted into an adjacent portion to the interface of the silicon substrate 6 and the silicon oxide film such as the gate oxide film 5 and the isolation oxide film 4. For example, the ion-implantation of boron is so accomplished that the leak guard boron diffusion layer 1 has a junction surface to the isolation oxide film 4 and its junction surface exists up to a level which is deeper than a predetermined depth.

Figure 7D:
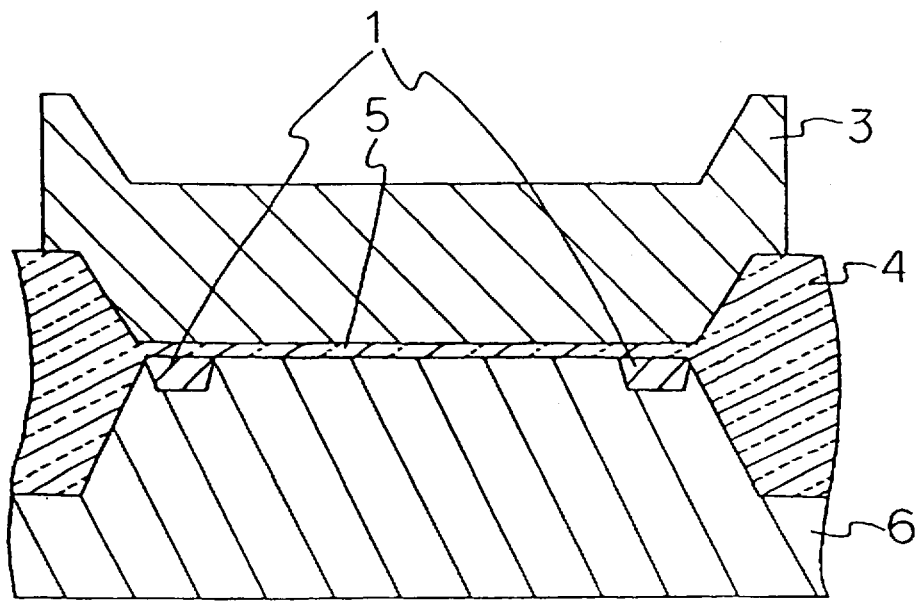

With reference to FIG. 7D, after the formation of the leak guard boron diffusion layers 1, the photo-resist mask 9 is removed. Subsequently, a chemical vapor deposition is so accomplished that polycrystalline silicon is deposited up to a thickness in the range from 3000 to 10000 angstroms on the gate oxide film 5 and the isolation oxide film 4. The deposited polycrystalline silicon is patterned by an ion-etching method thereby forming a polycrystalline silicon gate 3. After that, $n^+$-type diffusion layers 2 serving as source and drain regions are formed by a self-alignment technique which uses the polycrystalline silicon gate 3 as a mask member. The $n^+$-type source and drain diffusion layers 2 has a predetermined depth which is shallower than the deep level of the junction surface of the leak guard boron diffusion layer 1 and the isolation oxide film 4.

Figure 8:
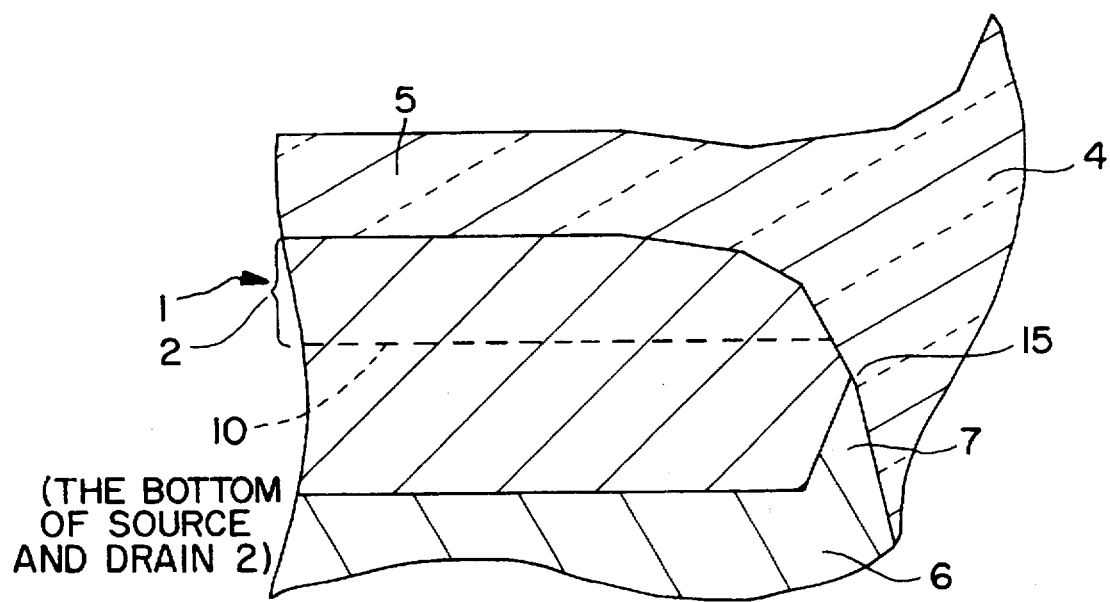
FIG. 8 is a fragmentary enlarged cross sectional elevation view illustrative (taken at B in FIG. 6) of an improved leak guard boron diffusion layer.

Such n-type type MOS field effect transistor having an anti-radioactivity is free from disadvantages such as the leak caused by the radiation damage. FIG. 8 is a fragmentary enlarged cross sectional view illustrative of the improved leak guard boron diffusion layer 1 involved in the novel n-channel MOS field effect transistor.

The leak guard boron diffusion layer 1 is formed in an upper surface of the p-type silicon substrate 6. The gate oxide film 5 overlays the leak guard boron diffusion layer 1. The isolation oxide film 4 overlays the p-type silicon substrate 6. A broken line 10 indicates a junction level of the $n^+$-type source and drain diffusion layers and the p-type silicon substrate 6.

In contrast to the prior art, a sufficient quantity of boron is implanted into an adjacent portion to the junction surfaces not only to the gate oxide film 5 but also to the isolation oxide film 4. Then, the leak guard boron diffusion layer 1 occupies the adjacent portion to the junction surfaces not only to the gate oxide film 5 but also to the isolation oxide film 4. The junction surface of the leak guard boron diffusion layer 1 to the isolation oxide film 4 exists below the broken line 10, and thus up to a level which is deeper than the predetermined depth corresponding to the junction surface of the $n^+$-type source and drain diffusion layers 2 and the p-type silicon substrate 6.

It will be described that such leak guard boron diffusion layer 1 is able to prevent any disadvantages such as the leak pass caused by the radiation damage. In general, when a radiation passes through the silicon oxide film such as the gate oxide film 5 and the isolation oxide film 4, electron-hole pairs are generated in the silicon oxide film. Electrons drift, but holes are trapped and thus remain in the silicon oxide film such as the gate oxide film 5 and the isolation oxide film 4.

As a result of those drifting electrons and entrapped holes, an interface charge of holes is formed, by which electrons are likely to be caused at an adjacent portion to the silicon oxide film such as the gate oxide film 5 and the isolation oxide film 4. However, there is an existence of the leak guard boron diffusion layer 1 having a high impurity concentration of boron which suppresses electrons. For example, electrons are caused but only at a portion 7 of the p-type silicon substrate 6, since the leak guard boron diffusion layer 1 has a high impurity concentration.

The portion 7 exists at point 15 below the junction level line 10 between the n-type source and drain diffusion layers 2 and the p-type silicon substrate 6.(Line 10 is the bottom of the source and drain 2.) is possible to make the conductive type of the portion 7 inverse. Thus, it is possible for an inversion layer to be formed at the portion 7 in the p-type silicon substrate 6. Even if any inversion layer formed at the portion 7 in the p-type silicon substrate 6, the $n^+$-type source and drain diffusion layers 2 does not become connective through the inversion layer formed in the portion 7 in the p-type silicon substrate 6 because, at 15, the portion 7 exists below the junction surface level line 10 at the bottom of the $n^+$-type source and drain diffusion layers 2. As a result of those levels 10 and 15, the existence of such leak guard boron diffusion layer 1 at the adjacent portion to the isolation oxide film 4 prevents a leak from being generated by the radiation damage of the silicon oxide film such as the gate oxide film 5 and the isolation oxide film 4. The preferred embodiment of the present invention makes, therefore, the n-channel MOS field effect transistor free from any disadvantages such as the leak pass provided by the radiation damage of the silicon oxide film. Thus, the present invention permits the n-channel MOS field effect transistor to possess an excellent anti-radioactivity.

In addition, with respect to the damage of the gate oxide film 5 by the ion-implantation processes, the ion-implantation for controlling the threshold voltage into the channel region is accomplished before the formation of the gate oxide film 5 so that the gate oxide film is free from any damage provided by the ion-implantation. The ion-implantation for forming the leak guard boron diffusion layers 1 is accomplished but after the formation of the gate oxide film 5 so that a sufficient quantity of boron is implanted into the portion adjacent to the isolation oxide film 4. Although the gate oxide film 5 suffers a damage provided by the ion-implantation for forming the leak guard boron diffusion layer, the existence of the leak guard boron diffusion layers 1 supports the threshold voltage at a high value thereby suppressing a leak to be generated.

Whereas modifications of the present invention will no doubt be apparent to a person of ordinary skilled in the art, it is to be understood that the embodiments shown and described by way of illustration are by no means intended to be considered in a limiting sense. Accordingly, it is to be intended by claims to cover all modifications of the invention which fall within the spirit and scope of the invention.

What is claimed is:

1. A field effect transistor comprising:
   a semiconductor substrate;
   field oxide films selectively formed in an upper portion of said substrate, said field oxide films having bottom areas;
   source and drain diffusion regions of a first conductivity type selectively formed in an upper portion of said substrate, each of said source and drain having a bottom area, said source and drain diffusion regions being separated from each other by a channel region, and said bottom areas of said source and drain regions extending to a level which is shallower than a level at said bottom of said isolation oxide film;

a gate oxide film formed on said channel region;

a gate electrode formed on said gate oxide film; and leak guard diffusion regions of a second conductivity type formed in an upper region of said substrate and along regions abutting inside edges of said isolation oxide films, each of said leak guard diffusion regions having a bottom, the bottom of each of said leak guard diffusion regions extending to a level which is shallower than a level of said bottom of said isolation oxide film but to a level which is deeper than said level at said bottoms of said source and drain diffusion regions, each of said leak guard diffusion regions having a first contact surface contacting said gate oxide film and a second contact surface contacting a bottom half part of said inside edge of said field oxide film, said bottom half part being embedded into said semiconductor substrate;

said second contact surface extending to a level which is deeper than said level of said bottoms of said source and drain regions but to a level which is shallower than said level of said bottoms of said field oxide films.

2. The transistor as claimed in claim 1, wherein said leak guard diffusion layers are p-type doped with boron.

3. The transistor as claimed in claim 1, wherein said leak guard diffusion layer has a p-type impurity.

4. The transistor as claimed in claim 1, wherein said gate has a self-aligned gate structure.

* * * * *